US012432846B2

(12) United States Patent
Takahashi

(10) Patent No.: US 12,432,846 B2
(45) Date of Patent: Sep. 30, 2025

(54) TECHNIQUE OF WIRING PROVIDED ON A WIRING CIRCUIT BOARD THAT IS MOUNTED IN AN ELECTRONIC APPARATUS

(71) Applicant: CANON KABUSHIKI KAISHA, Tokyo (JP)

(72) Inventor: Masayoshi Takahashi, Shizuoka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 538 days.

(21) Appl. No.: 17/940,140

(22) Filed: Sep. 8, 2022

(65) Prior Publication Data

US 2023/0082556 A1 Mar. 16, 2023

(30) Foreign Application Priority Data

Sep. 14, 2021 (JP) .................................. 2021-149579

(51) Int. Cl.
*H05K 1/02* (2006.01)
*H01L 23/00* (2006.01)
(Continued)

(52) U.S. Cl.
CPC ..... *H05K 1/0225* (2013.01); *H01L 23/49816* (2013.01); *H01L 23/49822* (2013.01);
(Continued)

(58) Field of Classification Search
CPC ...... H05K 1/0225; H05K 1/114; H05K 1/181; H05K 1/0219; H01L 23/49816;
(Continued)

(56) References Cited

U.S. PATENT DOCUMENTS

2005/0263881 A1 12/2005 Danno
2011/0074047 A1* 3/2011 Pendse .................. H01L 21/563
257/782
(Continued)

FOREIGN PATENT DOCUMENTS

JP 2005340741 A 12/2005
JP 2020119917 A 8/2020
(Continued)

*Primary Examiner* — Wael M Fahmy
*Assistant Examiner* — Tiberiu Dan Onuta
(74) *Attorney, Agent, or Firm* — ROSSI, KIMMS & McDOWELL LLP

(57) ABSTRACT

An electronic apparatus comprises a semiconductor device and a mounting substrate. The semiconductor device includes a semiconductor chip and a wiring circuit board. The chip includes a circuit blocks and first electrode pads. The wiring circuit board includes a first surface and a second surface. The first surface includes second electrode pads wirings. The second surface includes ball electrodes. A first wiring supplies a ground potential to a first circuit block. A second wiring supplies a ground potential to a second circuit block. The second surface includes a first extension pad and a second extension pad. The first extension pad and the second extension pad are disposed at positions at which they are connected to each other on the second surface side through a single ball electrode.

14 Claims, 8 Drawing Sheets

(51) Int. Cl.
*H01L 23/498* (2006.01)
*H01L 23/552* (2006.01)
*H05K 1/11* (2006.01)
*H05K 1/18* (2006.01)

(52) U.S. Cl.
CPC .. *H01L 23/49833* (2013.01); *H01L 23/49838* (2013.01); *H01L 23/552* (2013.01); *H01L 24/48* (2013.01); *H05K 1/114* (2013.01); *H05K 1/181* (2013.01); *H01L 2224/48227* (2013.01); *H01L 2924/1425* (2013.01); *H01L 2924/1427* (2013.01); *H01L 2924/1431* (2013.01); *H01L 2924/1432* (2013.01); *H01L 2924/1435* (2013.01); *H01L 2924/145* (2013.01); *H01L 2924/3011* (2013.01); *H01L 2924/3025* (2013.01)

(58) Field of Classification Search
CPC ......... H01L 23/49822; H01L 23/49833; H01L 23/49838; H01L 23/552; H01L 23/50; H01L 23/13; H01L 24/48; H01L 24/05; H01L 24/06; H01L 24/49; H01L 2224/48227; H01L 2224/04042; H01L 2224/05554; H01L 2224/06133; H01L 2224/06515; H01L 2224/49431; H01L 2224/49433; H01L 2224/49171; H01L 2924/1425; H01L 2924/1427; H01L 2924/1431; H01L 2924/1432; H01L 2924/1435; H01L 2924/145; H01L 2924/3011; H01L 2924/3025; H01L 2924/00014; H01L 2924/15311; H01L 2924/181

See application file for complete search history.

(56) References Cited

U.S. PATENT DOCUMENTS

| | | | |
|---|---|---|---|
| 2015/0078755 A1* | 3/2015 | Kaikkonen | G02B 6/4281 398/116 |
| 2020/0235068 A1 | 7/2020 | Oikawa | |
| 2021/0082796 A1* | 3/2021 | Shiomichi | H01L 23/64 |
| 2022/0130745 A1* | 4/2022 | Kellam | H01L 23/49838 |

FOREIGN PATENT DOCUMENTS

| | | |
|---|---|---|
| JP | 2021044458 A | 3/2021 |
| WO | 2010047228 A1 | 4/2010 |

\* cited by examiner

F I G. 11
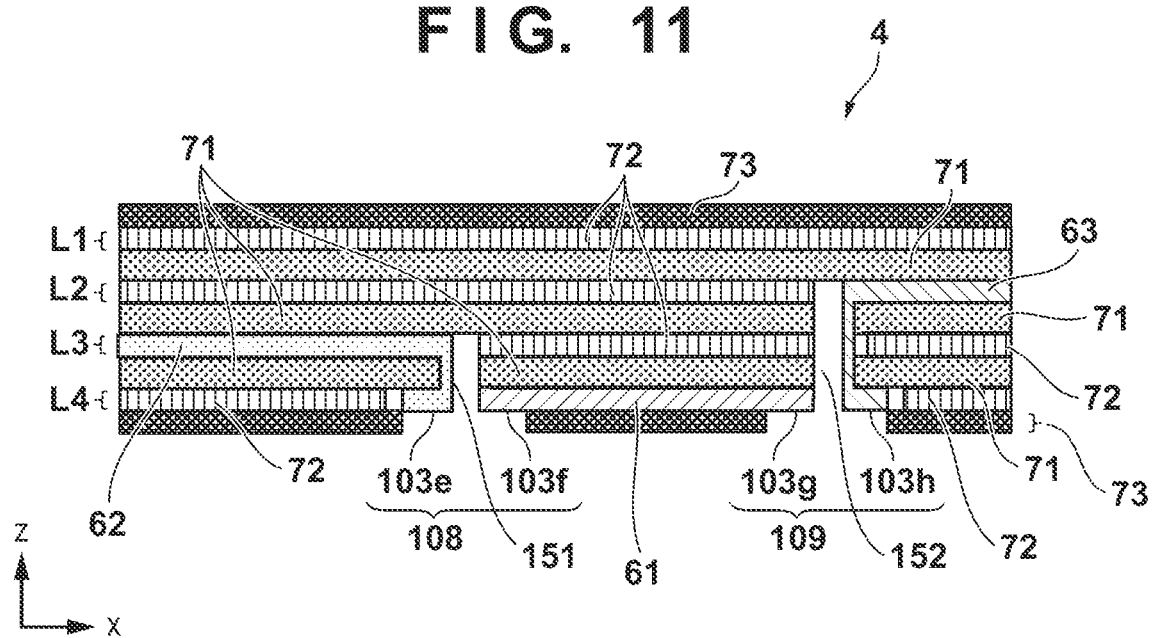

TECHNIQUE OF WIRING PROVIDED ON A WIRING CIRCUIT BOARD THAT IS MOUNTED IN AN ELECTRONIC APPARATUS

BACKGROUND OF THE INVENTION

Field of the Invention

The disclosure relates to a design technique of wiring to be provided on a wiring circuit board to be mounted in an electronic apparatus.

Description of the Related Art

It is important to reduce the electromagnetic interference (EMI) of a semiconductor device while improving the electromagnetic susceptibility (EMS). Reduction in the EMI can be achieved by decreasing unnecessary distribution of electromagnetic noise. Improvement in the EMS is realized by increasing the resistance to electromagnetic noise. Japanese Patent Laid-Open No. 2005-340741 proposes providing a plurality of terminals for individually supplying ground potentials to a plurality of circuit blocks that are mounted in a semiconductor device. This realizes a common ground potential between a plurality of circuit blocks while preventing a plurality of circuit blocks from having a common impedance. As a result, electromagnetic noise occurred in one specific circuit block is unlikely to sneak into another circuit block. That is to say, the EMI is reduced.

Japanese Patent Laid-Open No. 2021-044458 proposes providing individual ground wirings for a plurality of circuit blocks, connecting bonding pads to the respective ground wirings, and connecting extension pads to the bonding pads via a bonding wire. Furthermore, the impedances of the ground wirings are adjusted by connecting the plurality of extension pads using a wire. Accordingly, the EMI is reduced and the EMS is improved.

Incidentally, semiconductor devices are mounted on various mounting substrates having different designs, and thus there is a need to reduce the EMI and improve the EMS for each mounting substrate on which a semiconductor device is mounted. According to Japanese Patent Laid-Open No. 2021-044458, an impedance is adjusted in accordance with a plurality of extension pads being connected or not connected through wire bonding, and reduction in the EMI and improvement in the EMS are realized. However, it is not easy to adjust an impedance through wire bonding. Since wire bonding for adjusting an impedance and other wiring may interfere with each other, there have been cases where the degree of freedom of arrangement of wire bonding is limited.

SUMMARY OF THE INVENTION

The disclosure may provide an electronic apparatus comprising: a semiconductor device that includes a semiconductor chip provided with a plurality of circuit blocks and a plurality of first electrode pads connected to any of the plurality of circuit blocks, a wiring circuit board on which the semiconductor chip is mounted, and a sealer that seals the semiconductor chip on the wiring circuit board; and a mounting substrate on which the semiconductor device is mounted, wherein the wiring circuit board includes a first surface on which the semiconductor chip is mounted and a second surface that faces the mounting substrate, the first surface includes: a plurality of second electrode pads connected to the plurality of first electrode pads provided on the semiconductor chip, using a wire, and a plurality of wirings connected to any of the plurality of second electrode pads, the second surface includes a plurality of ball electrodes connected to any of the plurality of wirings and disposed to come into contact with a plurality of opposing pads provided on the mounting substrate, a first wiring among the plurality of wirings is a ground wiring for supplying a ground potential to a first circuit block among the plurality of circuit blocks, a second wiring among the plurality of wirings is a ground wiring for supplying a ground potential to a second circuit block among the plurality of circuit blocks, the second surface further includes a first extension pad connected to a first ball electrode connected to the first wiring and a second extension pad connected to a second ball electrode connected to the second wiring, and the first extension pad and the second extension pad are disposed at positions at which the first extension pad and the second extension pad are connected to each other on the second surface side through a single ball electrode.

Further features of the present invention will become apparent from the following description of exemplary embodiments (with reference to the attached drawings).

BRIEF DESCRIPTION OF THE DRAWINGS

FIG. 11 is a side view illustrating layers of a wiring circuit board.

DESCRIPTION OF THE EMBODIMENTS

Figure 1:
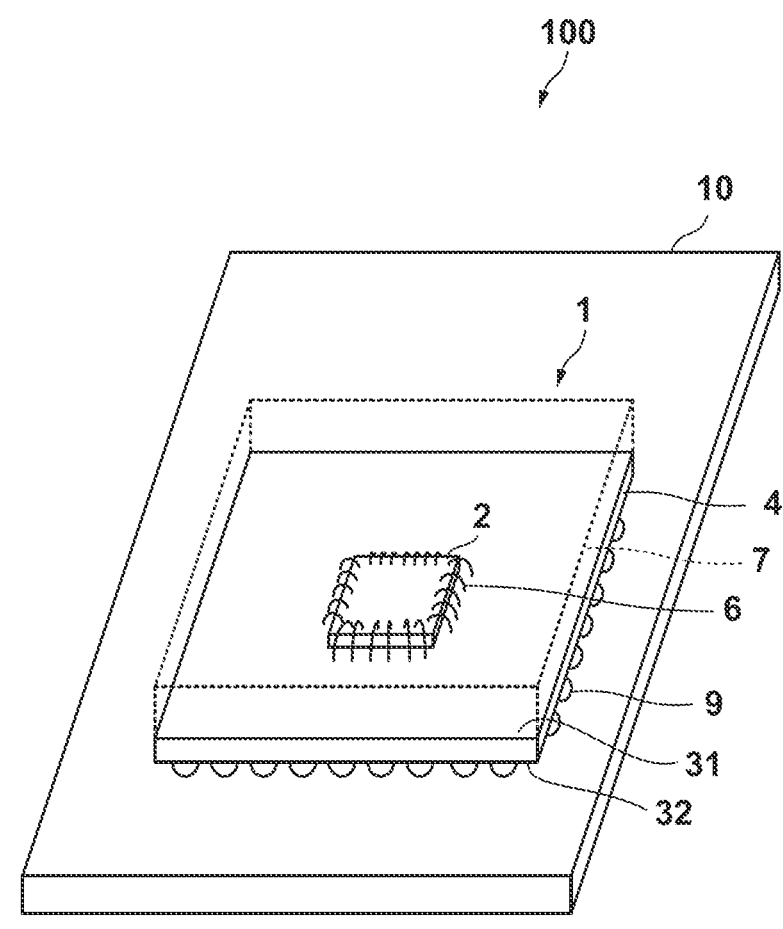
FIG. 1 is a perspective view illustrating an electronic apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar structures, and redundant description thereof is omitted.

First Embodiment

Structure of Semiconductor Device

As shown in FIG. 1, in an electronic apparatus 100, a semiconductor device 1 is mounted on a mounting substrate 10. The semiconductor device 1 includes a semiconductor chip 2, a wiring circuit board 4, bonding wires 6, a sealer 7, and ball electrodes 9. The semiconductor chip 2 is mounted on a first surface 31 of the wiring circuit board 4. The bonding wires 6 are electrically conductive, and electrically connect the semiconductor chip 2 and the wiring circuit board 4. The sealer 7 seals the semiconductor chip 2 and the plurality of bonding wires 6 onto the wiring circuit board 4, and is made of a resin. The plurality of ball electrodes 9 are disposed on a second surface 32 of the wiring circuit board 4. The second surface 32 is a surface on the opposite side to the first surface 31, and thus the first surface 31 may also be referred to as a "front surface" or "top surface", and the second surface 32 may also be referred to as a "back surface" or "bottom surface". Each ball electrode 9 is a type of external terminal. In this manner, the semiconductor device 1 is a ball grid array (BGA) semiconductor package.

Wiring Circuit Board and Semiconductor Chip

Figure 2:
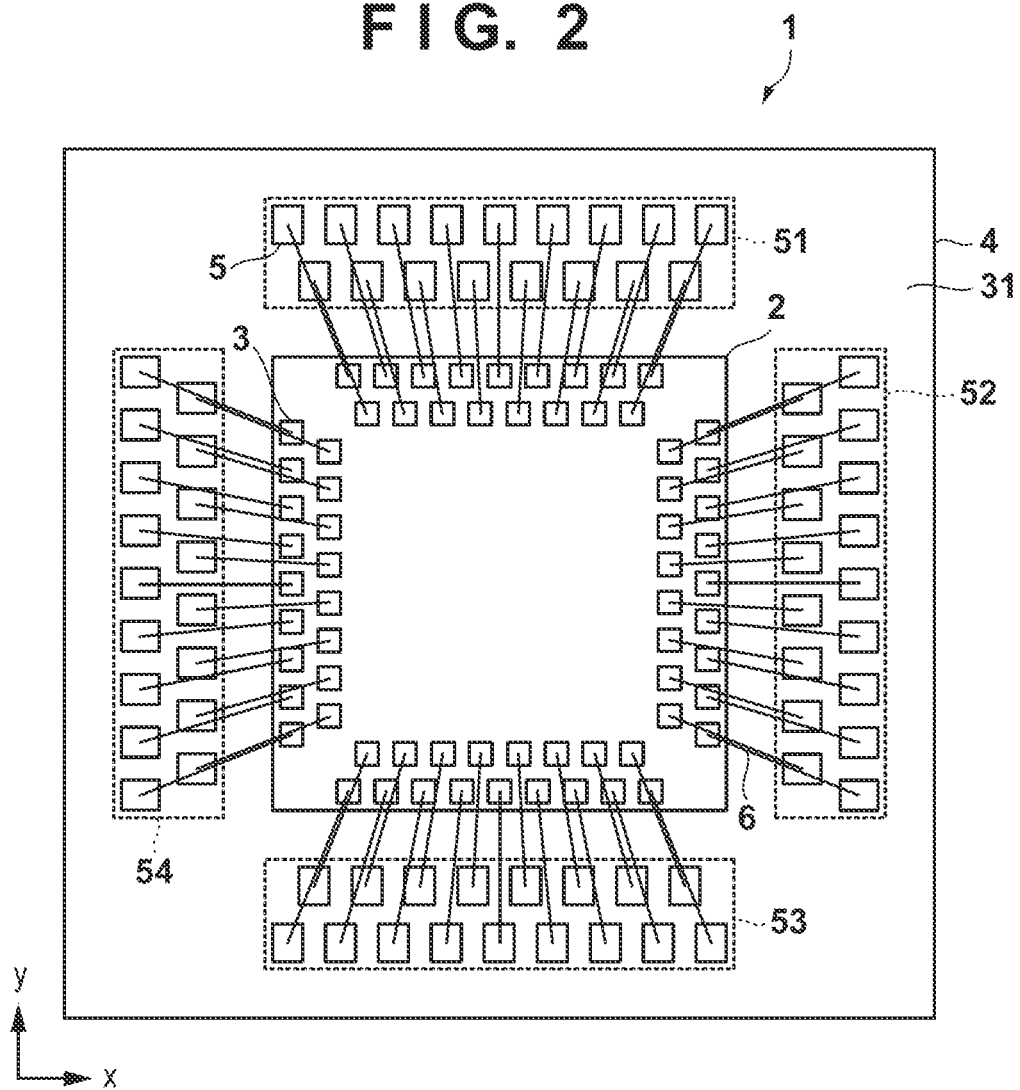
FIG. 2 is a plan view illustrating a semiconductor device.

As shown in FIG. 2, the semiconductor chip 2 is mounted at the center of the wiring circuit board 4. The semiconductor chip 2 includes a plurality of circuit blocks formed on semiconductor wafers made of silicon and the like. A plurality of electrode pads 3 are disposed in the vicinity of each of the four sides of the semiconductor chip 2. Each electrode pad 3 may be a power source terminal for supplying a power source voltage and a ground potential to a circuit block provided on the semiconductor chip 2, a signal terminal for inputting a signal to a circuit block, or a signal terminal for outputting a signal from a circuit block.

The wiring circuit board 4 is an electronic circuit board in which wiring patterns are formed using copper foil on a resin plate, for example. The wiring circuit board 4 includes bonding pad regions 51, 52, 53, and 54. The bonding pad regions 51, 52, 53, and 54 are disposed to face the plurality of electrode pads 3 provided in the vicinities of the sides of the semiconductor chip 2. A plurality of bonding pads 5 are provided in the bonding pad regions 51, 52, 53, and 54. The plurality of bonding pads 5 are electrically connected to the electrode pads 3 via the bonding wires 6, respectively. The plurality of bonding pads 5 are electrically connected to the ball electrodes 9 disposed on the second surface 32 of the wiring circuit board 4, through vias and the like, respectively. Usually, a via is a non-through hole that electrically connects a plurality of layers. The semiconductor chip 2 outputs/receives signals to/from the outside and receives/supplies a power source voltage and a ground potential, via the ball electrodes 9.

Structure of Semiconductor Chip

Figure 3:
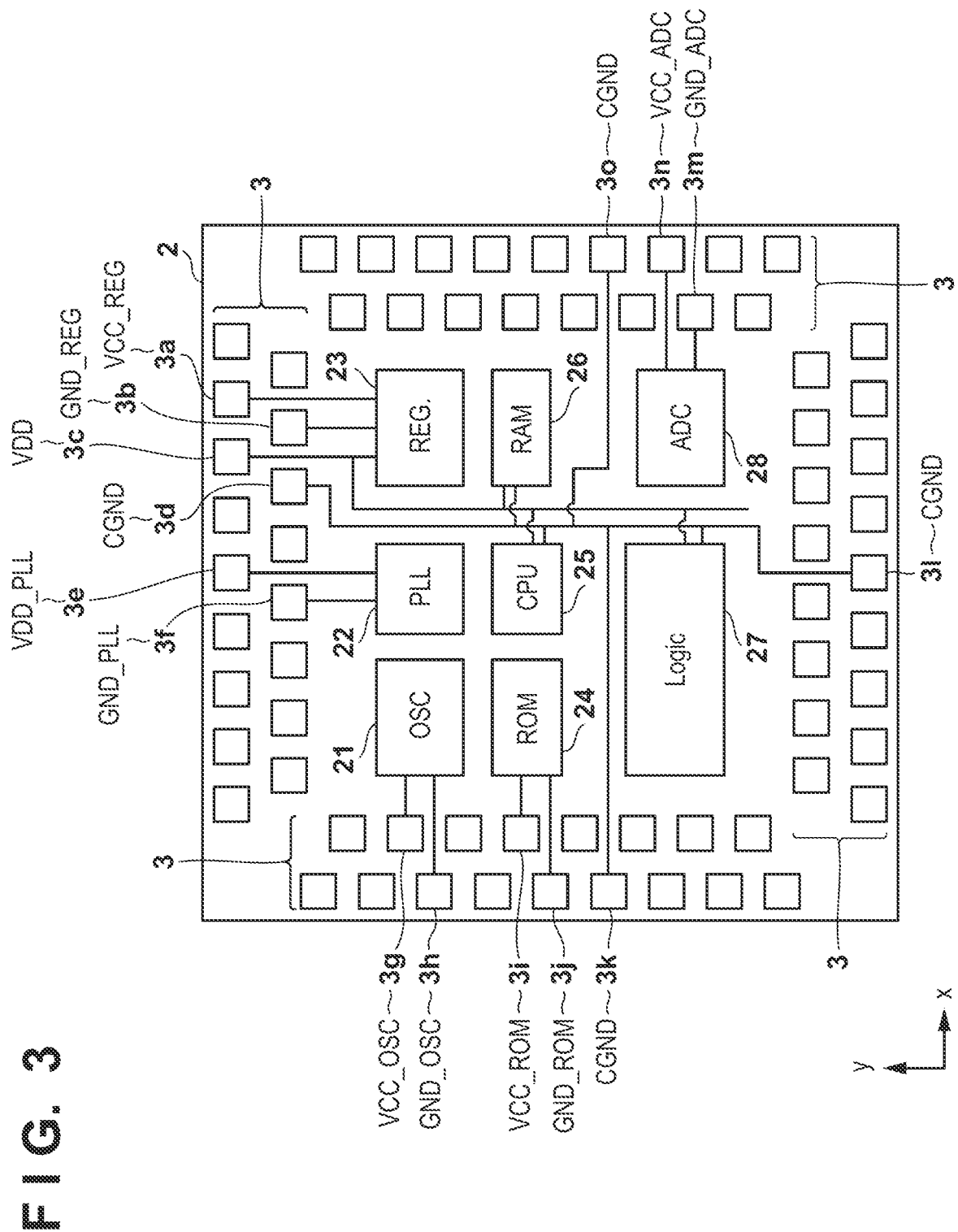
FIG. 3 is a plan view illustrating a semiconductor chip.

As shown in FIG. 3, the semiconductor chip 2 includes a plurality of circuit blocks. The plurality of circuit blocks include an OSC 21, a PLL 22, a REG 23, a ROM 24, a CPU 25, a RAM 26, a Logic 27, and an ADC 28, for example. Lower-case alphabets added to the end of a reference numeral assigned to a plurality of components may be omitted when a matter common to the plurality of components is described.

The OSC 21 is an oscillation circuit for generating a reference clock signal based on an input signal from a crystal oscillator that is outside the semiconductor chip 2. The OSC 21 is connected to an electrode pad 3g and an electrode pad 3h. The electrode pad 3g is a pad for receiving a power source voltage VCC_OSC. The electrode pad 3h is a pad for receiving a ground potential (hereinafter, also referred to as a "GND potential") GND_OSC.

The PLL 22 is a phase simultaneous circuit that multiplies the frequency of a reference clock signal generated by the OSC 21. The PLL 22 is connected to an electrode pad 3e and an electrode pad 3f. The electrode pad 3e is a pad for receiving a power source voltage VDD_PLL. The electrode pad 3f is a pad for receiving a GND potential GND_PLL. The OSC 21 and the PLL 22 are circuits for generating various clock signals based on a reference clock signal. The voltage level of a clock signal repeatedly changes. Therefore, oscillation noise may occur due to a clock signal. Oscillation noise may sneak in from one circuit block to another circuit block via a common impedance between a plurality of circuit blocks. Therefore, oscillation noise may increase the level of radiation noise, which is a major cause of EMI. In the first embodiment, in order to reduce the EMI within the semiconductor chip 2, a plurality of power source wirings for supplying a power source voltage are separated between a plurality of circuit blocks, and a plurality of ground wirings (hereinafter, referred to as "GND wirings") for supplying a GND potential are also separated between the plurality of circuit blocks. Accordingly, the plurality of circuit blocks do not have a common impedance.

The REG 23 is a linear regulator circuit for generating, based on a power source voltage supplied from a power source apparatus outside the semiconductor device 1, a power source voltage to be used inside the semiconductor chip 2. The REG 23 is connected to an electrode pad 3a, an electrode pad 3b, and an electrode pad 3c. The electrode pad 3a is a pad for receiving a power source voltage VDD supplied from an external power source apparatus. The electrode pad 3b is a pad for receiving a GND potential GND_REG. The electrode pad 3c is a pad for outputting a power source voltage VCC_REG generated by the REG 23.

The ROM 24 is a non-volatile memory that stores a control program to be executed by the CPU 25. The ROM 24 is connected to an electrode pad 3i and an electrode pad 3j. The electrode pad 3i is a pad for receiving a power source voltage VCC_ROM. The electrode pad 3j is a pad for receiving a GND potential GND_ROM. The CPU 25 reads out a control program stored in the ROM 24, and executes various types of computation processing in accordance with the control program.

The RAM 26 is a volatile memory. The RAM 26 temporarily stores data to be subjected to computation processing performed by the CPU 25, for example.

The Logic 27 includes a hardware circuit such as a communication circuit or a timer circuit. The Logic 27 executes an operation corresponding to an instruction output from the CPU 25.

The ADC 28 is an analog/digital conversion circuit that converts an analog signal input from an external terminal, into a digital signal. The ADC 28 is connected to an electrode pad 3n and an electrode pad 3m. The electrode pad 3n is a pad for receiving a power source voltage VCC_ADC. The electrode pad 3m is a pad for receiving a GND potential GND_ADC.

As shown in FIG. 3, the CPU 25, the RAM 26, and the Logic 27 are connected to the electrode pads 3c, 3d, 3k, 31, and 3o. The electrode pad 3c supplies a common power source voltage VDD to the CPU 25, the RAM 26, and the Logic 27. The electrode pads 3d, 3k, 31, and 3o supply a common GND potential CGND to the CPU 25, the RAM 26, and the Logic 27. In the first embodiment, a power source voltage required for each circuit block is different. Therefore, there are the power source voltage VDD and the power source voltage VCC.

Wiring Pattern of Wiring Circuit Board

Figure 4:
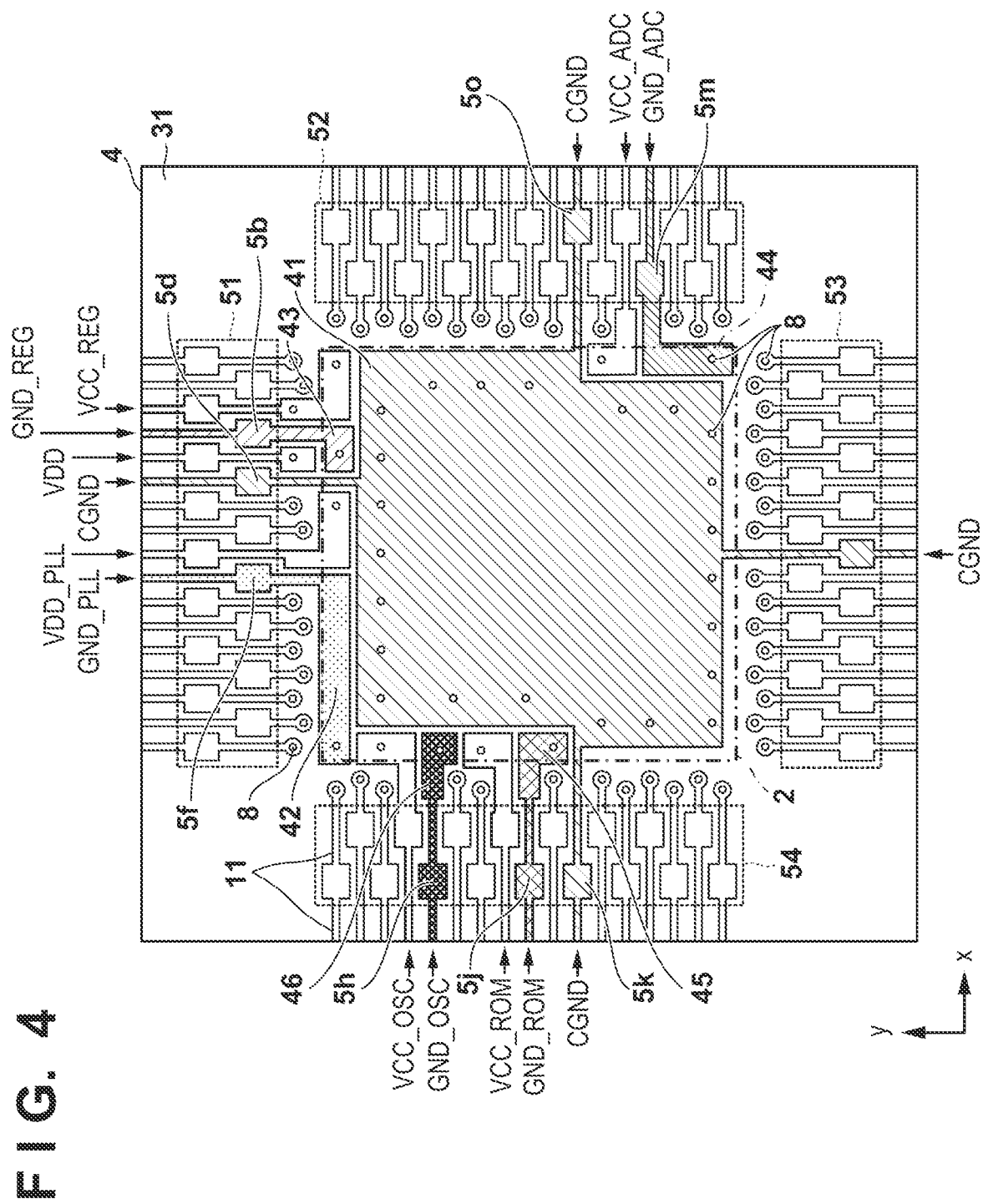
FIG. 4 is a plan view illustrating a wiring pattern on the front surface side of a wiring circuit board.

FIG. 4 shows an example of wiring patterns 11 provided on the first surface 31 of the wiring circuit board 4. The semiconductor chip 2 is mounted in a region on the first surface 31 surrounded by the dashed-dotted line. 17 bonding pads 5 arranged in two rows are provided in each of the bonding pad regions 51, 52, 53, and 54. In FIG. 4, among the wiring patterns 11 connected to the bonding pads 5 provided in the bonding pad regions 51, 52, 53, and 54, GND wirings for supplying a ground potential (e.g., GND_PLL and CGND) are hatched. The bonding pads 5 other than the bonding pads 5 of the GND wirings are not hatched. That is to say, the remaining bonding pads 5 are indicated by open graphics. The bonding pads 5 indicated by open graphics are connected to electrode pads 3 each functioning as one of a signal input terminal, a signal output terminal, and a power source terminal of the semiconductor chip 2. One ends of the wiring patterns 11 connected to the bonding pads 5 indicated by open graphics are connected to vias 8. The vias 8 are electrically connected to the ball electrodes 9 disposed on the second surface 32 of the wiring circuit board 4. As shown in FIG. 4, the other ends of all of the wiring patterns 11 extend to the sides (end portions) of the wiring circuit board 4. In this manner, the vias 8 are provided at one ends of the wiring patterns 11, the other ends of the wiring patterns 11 extend to the sides of the wiring circuit board 4, and the bonding pads 5 are provided at about the center of the wiring patterns 11.

Circles added to the one ends of the wiring patterns 11 connected to bonding pads 5 for the power source voltages VDD_PLL, VDD, VCC_REG, VCC_ADC, VCC_OSC, and VCC_ROM indicate vias 8. Circles added to the wiring patterns 11 connected to bonding pads 5 for the GND potentials GND_PLL, CGND, GND_REG, GND_ADC, GND_OSC, and GND_ROM also indicate vias 8. As shown in FIG. 4, the wiring patterns 11 for the GND potential CGND are provided at the four sides of the wiring circuit board 4, respectively. The four wiring patterns 11 for the GND potential CGND are connected to one another via a GND wiring 41 provided at a central portion of the wiring circuit board 4. The wiring pattern 11 for the GND potential GND_PLL is connected to a GND wiring 42. The wiring pattern 11 for the GND potential GND_REG is connected to a GND wiring 43.

In FIG. 4, a bonding pad 5*d* is connected to the GND wiring 41 for the GND potential CGND via the wiring pattern 11. A bonding pad 5*f* is connected to the GND wiring 42 for the GND potential GND_PLL via the wiring pattern 11. A bonding pad 5*b* is connected to the GND wiring 43 for the GND potential GND_REG via the wiring pattern 11.

A bonding pad 5*o* is connected to the GND wiring 41 for the GND potential CGND via the wiring pattern 11. A bonding pad 5*m* is connected to a GND wiring 44 for the GND potential GND_ADC via the wiring pattern 11. A bonding pad 5*k* is connected to the GND wiring 41 for the GND potential CGND via the wiring pattern 11. A bonding pad 5*j* is connected to a GND wiring 45 for the GND potential GND_ROM via the wiring pattern 11. A bonding pad 5*h* is connected to a GND wiring 46 for the GND potential GND_OSC via the wiring pattern 11.

The wiring patterns 11 for the power source voltages VDD_PLL, VDD, VCC_REG, VCC_ADC, VCC_OSC, and VCC_ROM are separate from one another. The bonding pads 5 of the wiring patterns 11 for these power source voltages are connected to the corresponding electrode pads 3. The wiring patterns 11 for the GND potentials GND_PLL, CGND, GND_REG, GND_ADC, GND_OSC, and GND_ROM are also separate from one another. The bonding pads 5 of the wiring patterns 11 for these GND potentials are also connected to the corresponding electrode pads 3.

The larger the number of power source wirings and the number of GND wirings are, the more the wiring efficiency on the mounting substrate 10 decreases. If the number of substrate layers constituting the mounting substrate 10 small (e.g., two layers), the wiring efficiency can decrease further. As a result, the individual impedance of one power source wiring or one GND wiring can be too high to ignore.

Figure 5:
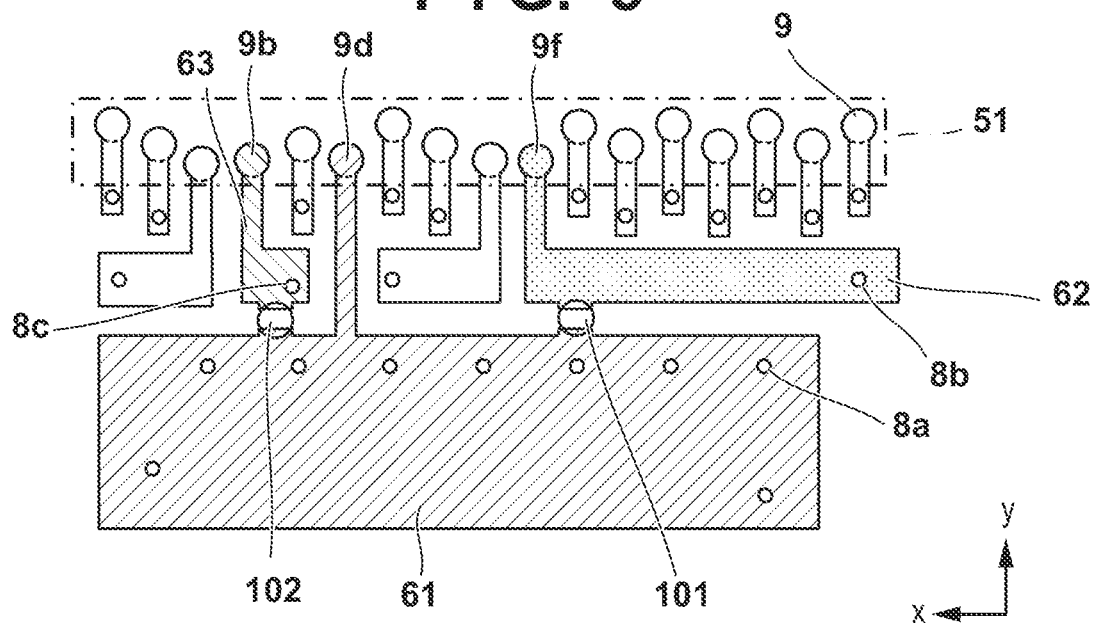
FIG. 5 is a plan view illustrating a wiring pattern on the back surface side of the wiring circuit board.

FIG. 5 shows an example of wiring patterns provided on the second surface 32 of the wiring circuit board 4. It should be noted that the viewpoint in FIG. 5 is on the second surface 32 side of the wiring circuit board 4, and FIG. 5 shows a horizontally flipped image of the first surface 31 shown in FIG. 4. FIG. 5 shows the vicinity of the back surface of a bonding pad region 51. A GND wiring 61 is connected to the GND wiring 41 provided on the first surface 31 via a plurality of vias 8*a*. Furthermore, the GND wiring 61 is connected to the bonding pad 5*d* via the GND wiring 41. A GND wiring 62 is connected to the GND wiring 42 on the first surface 31 via a via 8*b*. The GND wiring 62 is also connected to the bonding pad 5*f* via the GND wiring 42. A GND wiring 63 is connected to the GND wiring 43 on the first surface 31 via a via 8*c*. The GND wiring 63 is also connected to the bonding pad 5*b* via the GND wiring 43. The wiring patterns (indicated by open graphics) of wirings other than the GND wirings are respectively connected to the corresponding bonding pads 5 via the vias 8.

Ball electrodes 9 may be respectively provided for a plurality of bonding pads provided in the bonding pad region 51. A ball electrode 9*d* is provided for the bonding pad 5*d* via the GND wiring 41, the via 8*a*, and the GND wiring 61, for example. That is to say, these are electrically connected. Similarly, a ball electrode 9*f* is connected to the bonding pad 5*f* via the GND wiring 42, the via 8*b*, and the GND wiring 62. The ball electrode 9*b* is connected to the bonding pad 5*b* via the GND wiring 43, the via 8*c*, and the GND wiring 63. Accordingly, the plurality of the bonding pads 5 provided in the bonding pad region 51 can be electrically connected to the mounting substrate 10 via the ball electrodes 9. When a ball electrodes 9 is installed on an extension pad 101, the GND wiring 61 and the GND wiring 62 are connected via the ball electrode 9. When a ball electrode 9 is provided on an extension pad 102, the GND wiring 61 and the GND wiring 63 are connected via the ball electrode 9.

Figure 6A:
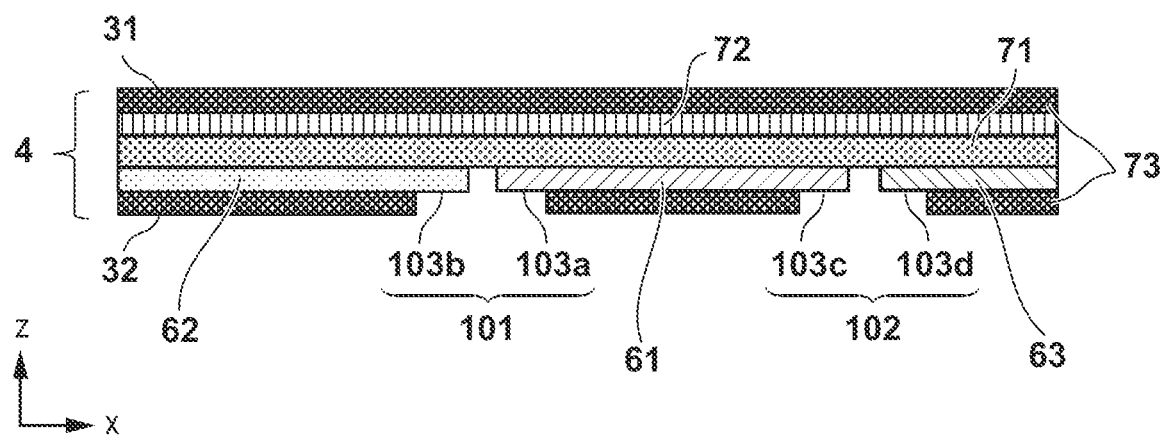
FIGS. 6A and 6B are side views illustrating layers of a wiring circuit board.

FIG. 6A is a side view of the wiring circuit board 4 in a state where ball electrodes 9 are not provided on the extension pads 101 and 102. Various wirings (power source wiring, signal wiring, GND wiring, etc.,) are generated using copper foils on the front layer side and the back layer side of a base material 71. Surfaces of the copper foils are covered by resists 73. In this example, the GND wiring 61 and the GND wiring 62 are provided on the back layer side of the base material 71. A wiring 72 is provided on the front layer side of the base material 71. The wiring 72 is composed of various wirings, including the GND wiring 61, the GND wiring 62, and the GND wiring 63. The GND wiring 61, the GND wiring 62, and the GND wiring 63 may be provided over two layers.

The extension pad 101 for connecting the GND wiring 61 and the GND wiring 62 is provided. Similarly, the extension pad 102 for connecting the GND wiring 61 and the GND wiring 63 is also provided. The extension pad 101 is constituted by an exposed copper foil 103*a* of the GND wiring 61 and an exposed copper foil 103*b* of the GND wiring 62. The extension pad 102 is constituted by an exposed copper foil 103*c* of the GND wiring 61 and an exposed copper foil 103*d* of the GND wiring 63. The exposed copper foils 103*a* to 103*d* are formed by not providing the resist 73, or removing portions of the resist 73 after providing it. Note that the exposed copper foils 103*a* to 103d function as electrodes, and thus each of the exposed copper foils 103a to 103d may also be referred to as an "extension pad".

Figure 6B:
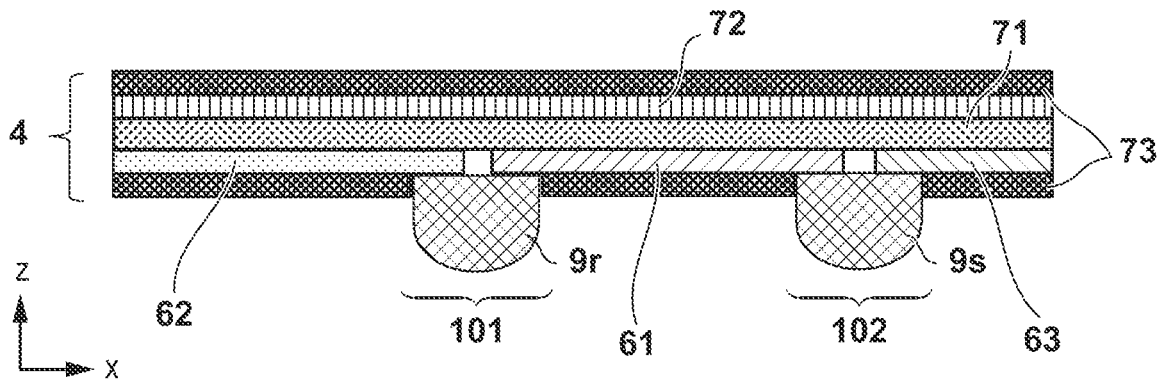

In FIG. 6B, ball electrodes 9r and 9s are respectively provided on the extension pads 101 and 102. Accordingly, the GND wiring 61 and the GND wiring 62 are connected, and the GND wiring 61 and the GND wiring 63 are connected.

Connection Between Semiconductor Device and Mount Substrate

Figure 7:
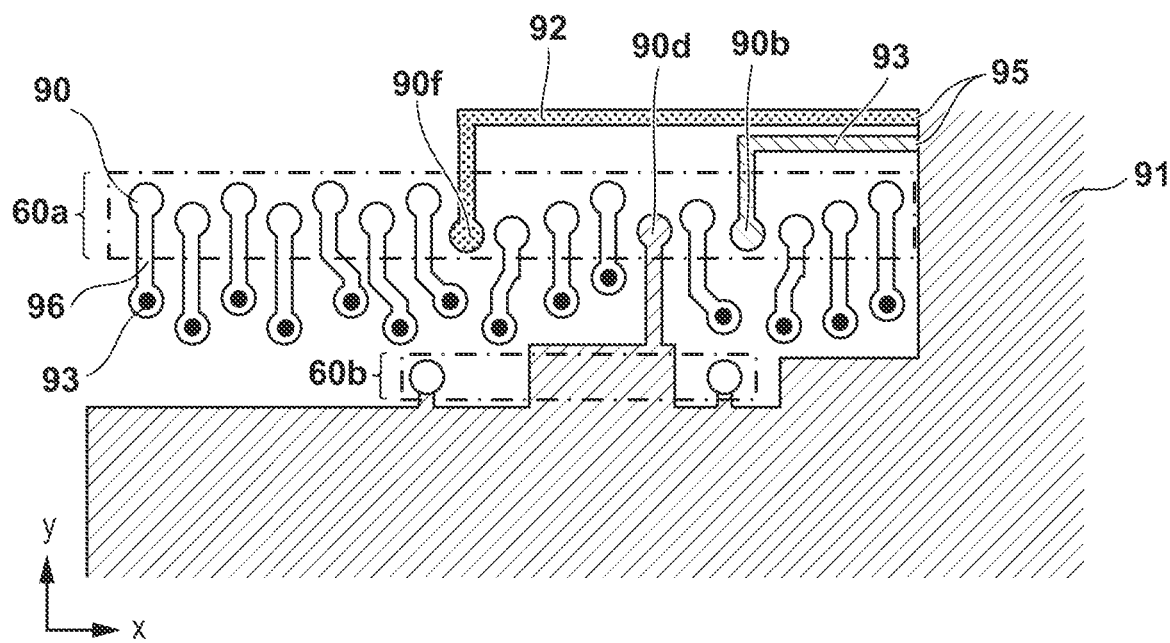
FIG. 7 is a plan view illustrating a wiring pattern on the front surface side of a mounting substrate.

FIG. 7 is a diagram showing an example of wiring patterns on the mounting substrate 10. Ball electrodes 9 of the semiconductor device 1 are placed on circular lands 90 disposed in regions 60a and 60b on the front surface side of the mounting substrate 10. Accordingly, the lands 90 and the ball electrodes 9 are electrically connected. A GND wiring 91 provided on the front surface side of the mounting substrate 10 forms a GND wiring pattern on the mounting substrate 10. The GND wiring 91 is connected to the GND wiring 61 on the second surface 32 of the wiring circuit board 4 via a land 90d and the ball electrode 9d, and is also connected to the GND wiring 41 on the first surface 31 of the wiring circuit board 4. A GND wiring 92 is also a GND wiring pattern of the mounting substrate 10. A GND wiring 93 is connected to the GND wiring 63 on the second surface 32 of the wiring circuit board 4 via a land 90b and the ball electrode 9b, and is connected to the GND wiring 43 on the first surface 31 of the wiring circuit board 4. The GND wiring 92 also forms a GND wiring pattern on the mounting substrate 10. The GND wiring 92 is connected to the GND wiring 62 on the second surface 32 of the wiring circuit board 4 via a land 90f and the ball electrode 9f, and is connected to the GND wiring 42 on the first surface 31 of the wiring circuit board 4.

Each wiring pattern 96 indicated as an open graphics is a signal wiring or a power source wiring. A circular land 90 is provided at one end of the wiring pattern 96, and a through hole 94 is provided at the other end. Usually, the through hole 94 refers to a hole extending though the substrate, into which a lead of an electronic device is inserted, but, in the present embodiment, may be an interstitial via into which a lead is not inserted. The GND wiring 91, the GND wiring 92, and the GND wiring 93 are electrically connected at a position 95. The position 95 is separate from the lands 90 of any wiring patterns 96 with which ball electrodes 9 of the semiconductor device 1 come into contact. In the first embodiment, lands 90 are not provided around the through holes, and thus may also be referred to as "pads".

When, for example, the individual impedance of the GND wiring 42 of the wiring circuit board 4 is high with respect to that of the GND wiring 41, the semiconductor chip 2 is likely to malfunction due to EMS. EMS causes a change in the ground potential of each GND wiring. Therefore, the GND wiring 42 whose individual impedance is high causes distortion in a clock generated by the PLL 22. The CPU 25 operates based on a clock signal supplied from the PLL 22. Therefore, timings of operations of the CPU 25 become inconsistent, and, for example, the CPU 25 enters an error state such as a bus fault.

There are also cases where the individual impedance of the GND wiring 43 of the wiring circuit board 4 is high with respect to that of the GND wiring 41. In this case, the semiconductor chip 2 is likely to malfunction due to EMS. That is to say, EMS changes the ground potential of each GND wiring. Therefore, the GND wiring 43 whose individual impedance is high causes distortion in a reference voltage generated by the REG 23. The CPU 25 operates based on a voltage supplied from the REG 23. Therefore, the CPU 25 may malfunction.

In the first embodiment, the extension pad 101 for connecting the GND wiring 61 and the GND wiring 62 is provided on the second surface 32 of the wiring circuit board 4 in order to avoid such an error state. The extension pad 101 is disposed between the ball electrode 9 provided on the second surface 32 side and the GND wiring 61. The GND wiring 61 is connected to the GND wiring 41. The GND wiring 62 is connected to the GND wiring 42. When the individual impedance of the GND wiring 42 is high with respect to that of the GND wiring 41, the GND wiring 61 and the GND wiring 62 are electrically connected by installing a ball electrode 9 on the extension pad 101. Accordingly, the individual impedance of the GND wiring 42 of the PLL 22 becomes low, and the PLL 22 is unlikely to malfunction. That is to say, the EMS improves.

As shown in FIG. 5, the extension pad 102 for connecting the GND wiring 61 and the GND wiring 63 is disposed between the GND wiring 63 connected to the ball electrode 9b, and the GND wiring 61. The GND wiring 61 is connected to the GND wiring 41 through the via 8a. The GND wiring 63 is connected to the GND wiring 43 through the via 8c. When the individual impedance of the GND wiring 43 is high with respect to that of the GND wiring 41, the GND wiring 61 and the GND wiring 63 are electrically connected by installing a ball electrode 9 on the extension pad 102. Accordingly, the individual impedance of the GND wiring 43 of the REG 23 becomes low, and the REG 23 is unlikely to malfunction. That is to say, the EMS improves.

In FIG. 5, the extension pad 101 and the extension pad 102 are provided, which is merely exemplary. An extension pad for connecting the GND wiring 61 to a GND wiring for one of the GND potentials GND_ADC, GND_OSC, and GND_ROM may be added.

Figure 8A:
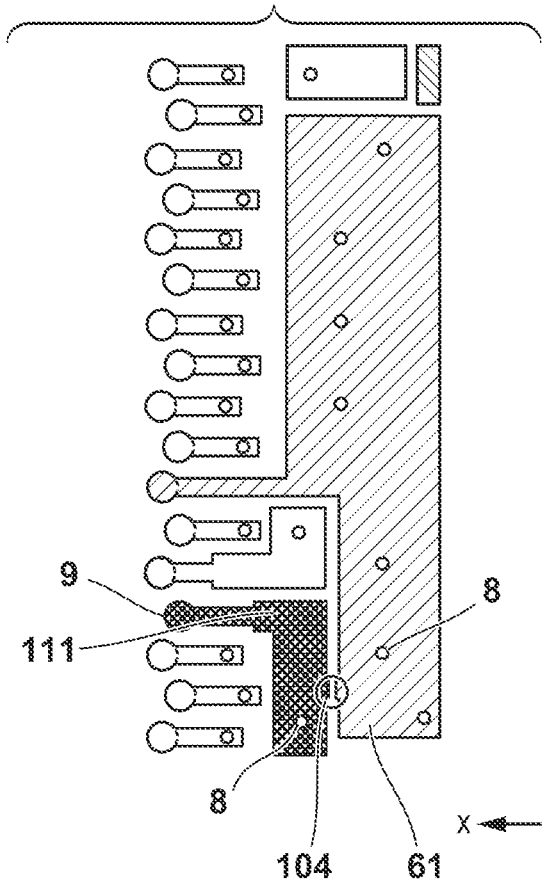
FIGS. 8A and 8B are plan views illustrating a wiring pattern on the back surface side of wiring circuit board.

FIG. 8A shows an extension pad 104 that connects the GND wiring 61 provided on the second surface 32 side and a GND wiring 111 for GND_ADC. The GND wiring 111 includes a ball electrode 9 and a via 8. The ball electrode 9 is disposed to be in electrical contact with a pad on the mounting substrate 10. The via 8 electrically connects the GND wiring 111 and the GND wiring 44 for the GND potential GND_ADC provided on the first surface 31 side. Thus, the GND wiring 61, the GND wiring 111, and the GND wiring 41 can be electrically connected by the ball electrode 9 being provided on the extension pad 104. Accordingly, the individual impedance can be adjusted.

Figure 8B:
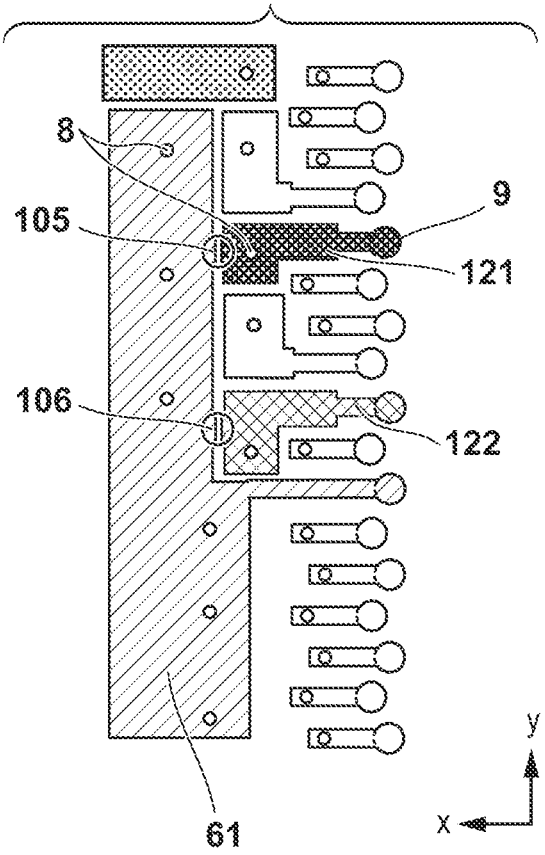

FIG. 8B shows an extension pad 105 that connects the GND wiring 61 provided on the second surface 32 side and a GND wiring 121 for GND_OSC. FIG. 8B also shows an extension pad 106 that connects the GND wiring 61 provided on the second surface 32 side and a GND wiring 122 for GND_ROM. The GND wiring 121 includes a ball electrode 9 and a via 8. The ball electrode 9 is disposed to be in electrical contact with a pad on the mounting substrate 10. The via 8 electrically connects the GND wiring 121 and the GND wiring 46 for the GND potential GND_OSC provided on the first surface 31 side. Thus, the GND wiring 61, the GND wiring 121, and the GND wiring 41 can be electrically connected by the ball electrode 9 being provided on the extension pad 105. Accordingly, the individual impedance can be adjusted. The GND wiring 122 includes a ball electrode 9 and a via 8. The ball electrode 9 is disposed to be in electrical contact with a pad on the mounting substrate 10. The via 8 electrically connects the GND wiring 122 and the GND wiring 45 for the GND potential GND_ROM provided on the first surface 31 side. Thus, the GND wiring 61, the GND wiring 122, and the GND wiring 41 can be electrically connected by the ball electrode 9 being provided on the extension pad 106. Accordingly, the individual impedance can be adjusted.

According to the first embodiment, the extension pads 101 to 106 are disposed on the second surface 32 of the wiring circuit board 4. It is possible to switch between connection and separation of a wiring pattern on the first surface 31 side and a wiring pattern on the second surface 32 side, in accordance with whether or not ball electrodes 9 are provided on the extension pads 101 to 106. Accordingly, it is possible to adjust an individual impedance and a common impedance. Also, the designer can select whether to prioritize reduction in the EMI or prioritize improvement in the EMS by using the extension pads 101 to 106. That is to say, the degree of freedom of routing on the mounting substrate 10 increases.

According to the first embodiment, impedance adjustment is realized in accordance with whether or not the ball electrodes 9 are connected to the extension pads 101 to 106. If the mounting substrate 10 is changed in order to reduce the manufacturing cost, an impedance condition changes, and thus there can be a need to revise the version of the wiring circuit board 4. However, in the first embodiment, an impedance can be adjusted in accordance with the presence or absence of ball electrodes 9, and thus there is no need to revise the version of the wiring circuit board 4, reducing the manufacturing cost. Even after the package of the semiconductor device 1 is made, it is possible to change combinations of the presence or absence of the ball electrodes 9, and thus the degree of freedom of design of the electronic apparatus 100 that includes the semiconductor device 1 and the mounting substrate 10 increases.

Second Embodiment

The extension pads 101 to 106 and the ball electrodes 9 according to the first embodiment connect two wirings. In view of this, in a second embodiment, connecting three GND wirings using one extension pad and one ball electrode 9 is proposed. In the second embodiment, a description of matters same as or similar to those of the first embodiment is omitted, and the description in the first embodiment applies.

Wiring Pattern of Wiring Circuit Board

Figure 9:
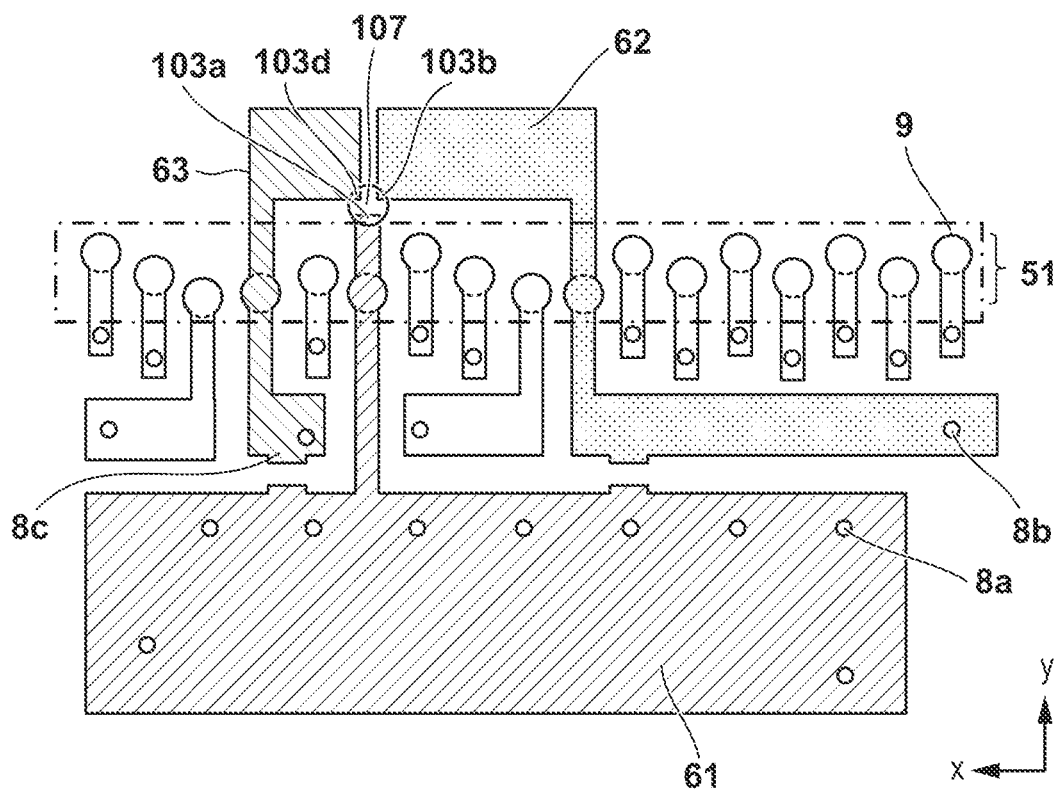
FIG. 9 is a plan view illustrating a wiring pattern on the back surface side of the wiring circuit board.

FIG. 9 shows an example of wiring patterns on the second surface 32 side of the wiring circuit board 4. In FIG. 9, the GND wiring 61, the GND wiring 62, and the GND wiring 63 extend longer in the y direction than in FIG. 5. Furthermore, an extension pad 107 is provided at a position at which the GND wiring 61, the GND wiring 62, and the GND wiring 63 are closest to one another. The extension pad 107 includes the exposed copper foils 103a, 103b, and 103d. The exposed copper foil 103a is a portion of the GND wiring 61. The exposed copper foil 103b is a portion of the GND wiring 62. The exposed copper foil 103d is a portion of the GND wiring 63. The GND wiring 61, the GND wiring 62, and the GND wiring 63 are collectively electrically connected by one ball electrode 9 being provided on the extension pad 107.

Connection Between Semiconductor Device and Mount Substrate

Figure 10:
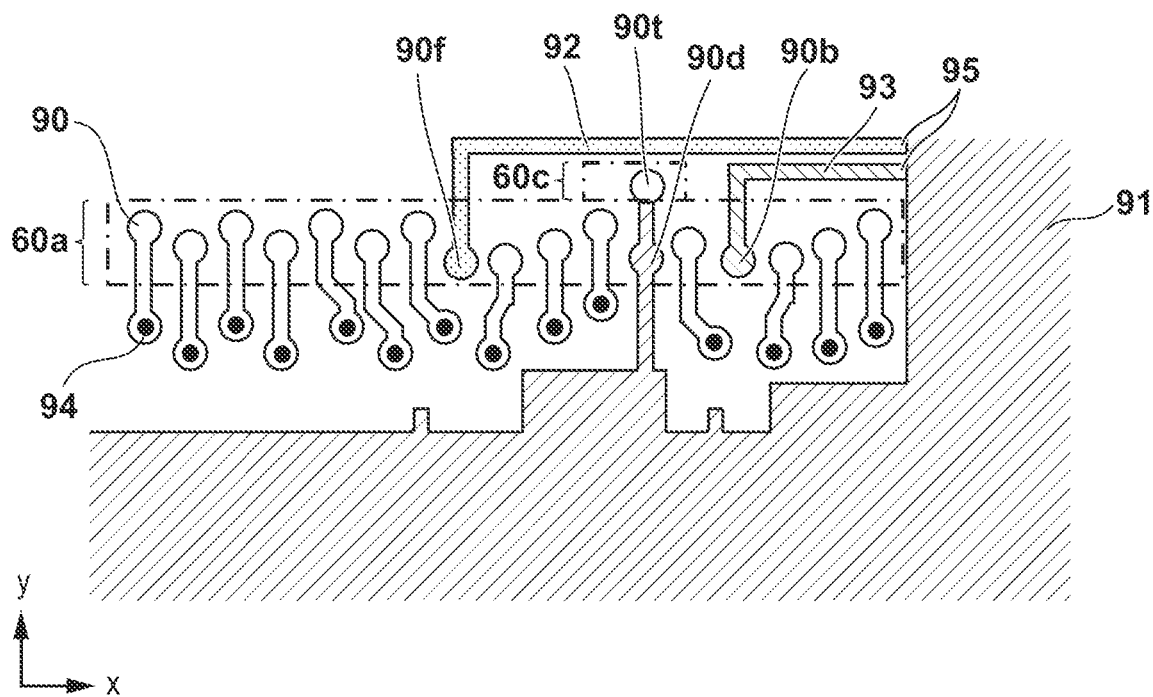
FIG. 10 is a plan view illustrating a wiring pattern on the front surface side of mounting substrate.

FIG. 10 is a figure corresponding to FIG. 7 in the first embodiment, and shows the front surface side of the mounting substrate 10. In FIG. 10, a portion of the GND wiring 91 extends longer in the y direction than in FIG. 7, and is connected to a circular land 90t provided in a region 60c on the front surface side of the mounting substrate 10. The position in the xy coordinates of the land 90t matches the position in the xy coordinate of the extension pad 107. Once a ball electrode 9 is placed on the land 90t, the land 90t and the ball electrode 9 are electrically connected. Moreover, in the extension pad 107, the ball electrode 9 electrically connects the GND wiring 61, the GND wiring 62, and the GND wiring 63. Furthermore, the GND wiring 91 is connected to the GND wiring 61 and the GND wiring 41 of the wiring circuit board 4. The GND wiring 93 is also connected to the GND wiring 63 and the GND wiring 43 via the land 90 and the ball electrode 9. The GND wiring 92 is also connected to the GND wiring 62 and the GND wiring 42 via the land 90 and the ball electrode 9.

As described in the first embodiment, when the individual impedances of the GND wiring 42 and the GND wiring 43 are high with respect to that of the GND wiring 41, the semiconductor chip 2 is likely to malfunction. That is to say, when the ground potential of each GND wiring changes, the GND wiring 42 and the GND wiring 43 whose individual impedances are high cause distortion in a clock generated by the PLL 22. Alternatively, distortion may occur in a reference voltage generated by the REG 23. These cause the CPU 25 and the like to malfunction.

In the second embodiment, the extension pad 107 that can connect the GND wiring 61, the GND wiring 62, and the GND wiring 63 is provided on the second surface 32 side of the wiring circuit board 4. When the individual impedances of the GND wiring 42 and the GND wiring 43 are high with respect to that of the GND wiring 41, the GND wiring 61, the GND wiring 62, and the GND wiring 63 are electrically connected by installing one ball electrode 9 on the extension pad 107. Accordingly, the individual impedance of the GND wiring 42 of the PLL 22 becomes low, the EMS improves, and the PLL 22 is unlikely to malfunction. Furthermore, the individual impedance of the GND wiring 43 of the REG 23 is also made low, and thus the EMS improves and the REG 23 is unlikely to malfunction.

In the second embodiment, three GND wirings are connected by one ball electrode and one extension pad, but this is merely exemplary. Four or more GND wirings may be connected by one ball electrode and one extension pad. Other advantages of the second embodiment are common with the first embodiment, and thus a description thereof is omitted.

Third Embodiment

In the first and second embodiments, the number of layers of the wiring circuit board 4 is two. In a third embodiment, a wiring circuit board 4 that includes three or more layers will be described. In the third embodiment, a description of matters same as or similar to those of the first and second embodiments is omitted, and the description in the first and second embodiments applies.

Wiring Pattern of Wiring Circuit Board

The number of wiring layers of the wiring circuit board 4 shown in FIG. 11 is four. That is to say, the wiring circuit board 4 includes layers L1 to L4. The base material 71 is disposed between adjacent layers. The GND wiring 61 is disposed in the layer L4. The GND wiring 62 is disposed in the layer L3. The GND wiring 63 is provided ion the layer L2. The GND wiring 62 provided in the layer L3 extends to the layer L4 due to a through hole 151. An extension pad 108 is constituted by an exposed copper foil 103e of the GND wiring 62 and an exposed copper foil 103f of the GND wiring 61, the foils being exposed from the layer L4. The GND wiring 61 and the GND wiring 62 are electrically connected by a ball electrode 9 being provided on the extension pad 108. The GND wiring 63 provided on the layer L2 extends to the layer L4 due to a through hole 152. An extension pad 109 is constituted by an exposed copper foil 103*h* of the GND wiring 63 and an exposed copper foil 103*g* of the GND wiring 61, the foils being exposed from the layer L4. The GND wiring 61 and the GND wiring 63 are electrically connected by a ball electrode 9 being provided on the extension pad 109.

Also in the third embodiment, similarly to the first embodiment, when the individual impedance of the GND wiring 42 is high with respect to that of the GND wiring 41, one ball electrode 9 is installed on the extension pad 108. Accordingly, the GND wiring 61 and the GND wiring 62 are electrically connected. As a result, the individual impedance of the GND wiring 42 of the PLL 22 becomes low, the EMS improves, and the PLL 22 is unlikely to malfunction. When the individual impedance of the GND wiring 43 is high with respect to that of the GND wiring 41, a ball electrode 9 is provided on the extension pad 109. Accordingly, the GND wiring 61 and the GND wiring 63 are electrically connected, and the individual impedance of the GND wiring 43 of the REG 23 becomes low. Therefore, the EMS of the REG 23 improves, and the REG 23 is unlikely to malfunction.

As a result of the wiring circuit board 4 having a plurality of layers, it is possible to spread a GND wiring over a plurality of layers. Accordingly, the GND wirings connected to the extension pads 108 and 109 can be made thick in the wiring circuit board 4, and an individual impedance can be made lower. Other advantages in the third embodiment are same as the advantages of the first embodiment, and thus a description thereof is omitted.

Technical Ideas Derived from Embodiments

Viewpoints 1, 13, and 14

As shown in FIG. 1, the semiconductor device 1 may include the semiconductor chip 2, the wiring circuit board 4 on which the semiconductor chip 2 is mounted, and the sealer 7 that seals the semiconductor chip 2 on the wiring circuit board. The semiconductor chip 2 includes a plurality of circuit blocks, and a plurality of first electrode pads (e.g., the electrode pads 3) connected to the plurality of circuit blocks. The electronic apparatus 100 includes the semiconductor device 1 and the mounting substrate 10 on which the semiconductor device 1 is mounted. The wiring circuit board 4 may include the first surface 31 on which the semiconductor chip 2 is mounted and the second surface 32 opposing the mounting substrate 10. The first surface 31 includes a plurality of second electrode pads (e.g., a plurality of bonding pads 5) connected to the plurality of first electrode pads provided on the semiconductor chip 2, using wires. The first surface 31 may also include a plurality of wirings (the GND wirings 41 to 46) connected to a plurality of bonding pads. The second surface 32 may include a plurality of the ball electrodes 9 disposed so as to come into contact with a plurality of opposing pads (e.g., the lands 90) provided on the mounting substrate 10. A first wiring (e.g., the GND wiring 41) among a plurality of wirings is a ground wiring for supplying a ground potential to a first circuit block (e.g., the CPU 25, the RAM 26) among the plurality of circuit blocks. A second wiring (e.g., the GND wiring 42) among the plurality of wirings is a ground wiring for supplying a ground potential to a second circuit block (e.g., the PLL 22) among the plurality of circuit blocks. The second surface 32 may also include a first extension pad (e.g., the exposed copper foil 103*a*) and a second extension pad (e.g., the exposed copper foil 103*b*). The first extension pad is a pad connected to a first ball electrode (e.g., the ball electrode 9*d*) connected to the first wiring. The second extension pad is a pad connected to a second ball electrode (e.g., the ball electrode 9*f*) connected to the second wiring. As shown in FIGS. 6A and 6B, the first extension pad and the second extension pad are disposed at positions at which these extension pads can be connected to each other on the second surface 32 side, using the single ball electrode 9*r*. Conventionally, a plurality of GND wirings are connected using bonding wires, and thus there were various difficulties. However, according to the first to third embodiments, a plurality of GND wirings can be connected using an extension pad and a ball electrode. Thus, reduction in EMI and improvement in EMS are achieved more easily than conventionally.

Viewpoint 2

Before the first extension pad and the second extension pad are connected using the single ball electrode 9*r*, the individual impedance of the second wiring is high with respect to the individual impedance of the first wiring. In this case, after the first extension pad and the second extension pad are connected using the single ball electrode 9*r*, the individual impedance of the second wiring becomes low. Reduction in EMI and improvement in EMS are achieved more easily than conventionally by executing such impedance adjustment.

Viewpoint 3

As described with reference to FIG. 5, the via 8*a* is an example of a first via for connecting the first wiring and the first extension pad. The via 8*b* is an example of a second via for connecting the second wiring and the second extension pad. By using the vias 8 in this manner, it is possible to more easily establish electrical continuity between a wiring on the first surface 31 side of the wiring circuit board 4 and an extension pad on the second surface 32 side.

Viewpoint 4

The GND wiring 61 is provided on the second surface 32 or inside the wiring circuit board 4, and is an example of a first ground pattern that connects a first ball electrode (e.g., the ball electrode 9*d*) and the first extension pad. The GND wiring 62 is provided on the second surface 32 or inside the wiring circuit board 4, and is an example of a second ground pattern that connects a second ball electrode (e.g., the ball electrode 9*f*) and the second extension pad. In this manner, reduction in EMI and improvement in EMS are achieved more easily than conventionally, by further providing a GND wiring on the second surface 32 or inside the wiring circuit board 4.

Viewpoint 5

As shown in FIGS. 6A and 6B, the first ground pattern and the second ground pattern may be disposed in the same layer inside the wiring circuit board 4. In this case, the first extension pad is a portion of the first ground pattern exposed on the second surface side (e.g., the exposed copper foil 103*a*). The second extension pad is a portion of the second ground pattern exposed on the second surface side (e.g., the exposed copper foil 103*b*).

Viewpoint 6

As shown in FIG. 11, the first ground pattern may also be disposed in a first layer (e.g., the layer L4) that is inside the wiring circuit board. The second ground pattern may also be disposed in the second layer (e.g., the layer L3) that is inside the wiring circuit board. In this case, the first extension pad is a portion of the first ground pattern exposed on the second surface side (e.g., the exposed copper foil 103*f*). The second extension pad is a portion of the second ground pattern provided in the second layer, the portion extending to the first layer and exposed on the second surface side (e.g., the exposed copper foil 103*e*). By adopting such a multilayer structure, the ground pattern can be made thick, and an individual impedance can be made lower. Therefore, reduction in EMI and improvement in EMS are achieved more easily than conventionally.

Viewpoint 7

As shown in FIG. 7, the mounting substrate 10 may also include a wiring group (e.g., the GND wirings 91 and 92) that connects a first opposing pad (e.g., the land 90*d*) that comes into contact with the first ball electrode and a second opposing pad (e.g., the land 90*f*) that comes into contact with the second ball electrode.

Viewpoint 8

A third wiring (e.g., the GND wiring 43) among the plurality of wirings provided on the wiring circuit board 4 is a ground wiring for supplying a ground potential to a third circuit block (e.g., the REG 23) among the plurality of circuit blocks. The ball electrode 9*b* is an example of a third ball electrode connected to the third wiring. The exposed copper foil 103*d* is an example of a third extension pad connected to the ball electrode 9*b*. The exposed copper foil 103*c* is an example of a fourth extension pad connected to the first ball electrode connected to the first wiring, among the plurality of ball electrodes provided on the second surface. As shown in FIGS. 6A and 6B, the third extension pad and the fourth extension pad are disposed at positions at which these extension pads can be connected to each other on the second surface side using a single ball electrode (e.g., the ball electrode 9*s*).

Viewpoint 9

Before the third extension pad and the fourth extension pad are connected by the single ball electrode, the individual impedance of the third wiring may be high with respect to the individual impedance of the first wiring. In this case, after the third extension pad and the fourth extension pad are connected using the single ball electrode, the individual impedance of the third wiring becomes low. Therefore, reduction in EMI and improvement in EMS are achieved more easily than conventionally.

Viewpoint 10

As shown in FIG. 9, the first extension pad, the second extension pad, and the third extension pad may also be disposed at positions at which these extension pads can be connected to one another on the second surface side using a single ball electrode. In this manner, by three extension pads being connected to each other using a single ball electrode, reduction in EMI and improvement in EMS are achieved more easily than conventionally.

Viewpoint 11

Before the first extension pad, the second extension pad, and the third extension pad are connected using a single ball electrode, the individual impedance of the second wiring may be high with respect to the individual impedance of the first wiring. The individual impedance of the third wiring may be high with respect to the individual impedance of the first wiring. In this case, after the first extension pad, the second extension pad, and the third extension pad are connected using a single ball electrode, the individual impedance of the second wiring and the individual impedance of the third wiring become low. The impedances of a plurality of wirings can be adjusted due to a single ball electrode in this manner, and thus reduction in EMI and improvement in EMS are achieved more easily than conventionally.

Viewpoint 12

The via 8*c* is an example of a third via for connecting the third wiring and the third extension pad. By using the via 8 in this manner, it is possible to more easily establish electrical continuity between the GND wiring 43 on the first surface 31 side of the wiring circuit board 4 and an extension pad on the second surface 32 side (e.g., the exposed copper foil 103*d*).

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-149579, filed Sep. 14, 2021 which is hereby incorporated by reference herein in its entirety.

What is claimed is:

1. An electronic apparatus comprising:
   a semiconductor device that includes a semiconductor chip provided with a plurality of circuit blocks and a plurality of first electrode pads connected to any of the plurality of circuit blocks, a wiring circuit board on which the semiconductor chip is mounted, and a sealer that seals the semiconductor chip on the wiring circuit board; and
   a mounting substrate on which the semiconductor device is mounted,
   wherein the wiring circuit board includes a first surface on which the semiconductor chip is mounted and a second surface that faces the mounting substrate, the first surface includes:
a plurality of second electrode pads connected to the plurality of first electrode pads provided on the semiconductor chip, using a wire, and
a plurality of wirings connected to any of the plurality of second electrode pads,
the second surface includes a plurality of ball electrodes connected to any of the plurality of wirings and disposed to come into contact with a plurality of opposing pads provided on the mounting substrate,
a first wiring among the plurality of wirings is a ground wiring for supplying a ground potential to a first circuit block among the plurality of circuit blocks,
a second wiring among the plurality of wirings is a ground wiring for supplying a ground potential to a second circuit block among the plurality of circuit blocks,
the second surface further includes a first extension pad connected to a first ball electrode connected to the first wiring and a second extension pad connected to a second ball electrode connected to the second wiring, and
the first extension pad and the second extension pad are disposed at positions at which the first extension pad and the second extension pad are connected to each other on the second surface side through a single ball electrode.

2. The electronic apparatus according to claim 1, wherein
before the first extension pad and the second extension pad are connected through the single ball electrode, an individual impedance of the second wiring is high with respect to an individual impedance of the first wiring, and
after the first extension pad and the second extension pad are connected through the single ball electrode, the individual impedance of the second wiring becomes low.

3. The electronic apparatus according to claim 1, further comprising:
a first via configured to connect the first wiring and the first extension pad; and
a second via configured to connect the second wiring and the second extension pad.

4. The electronic apparatus according to claim 1, wherein
the plurality of opposing pads includes a first opposing pad and a second opposing pad,
the first opposing pad comes into contact with the first ball electrode,
the second opposing pad comes into contact with the second ball electrode, and
the mounting substrate includes a wiring group that connects the first opposing pad and the second opposing pad.

5. The electronic apparatus according to claim 1, wherein
the plurality of wirings provided on the wiring circuit board includes a third wiring,
the third wiring is a ground wiring that supplies a ground potential to a third circuit block among the plurality of circuit blocks,
the plurality of ball electrodes provided on the second surface includes a third ball electrode connected to the third wiring,
the second surface further includes a third extension pad connected to the third ball electrode, and
the first extension pad, the second extension pad, and the third extension pad are disposed at positions at which the first extension pad, the second extension pad, and the third extension pad are connected to each other on the second surface side through a single ball electrode.

6. The electronic apparatus according to claim 5, wherein
before the first extension pad, the second extension pad, and the third extension pad are connected through a single ball electrode, individual impedances of the second wiring and the third wiring are high with respect to an individual impedance of the first wiring, and
after the first extension pad, the second extension pad, and the third extension pad are connected through a single ball electrode, the individual impedances of the second wiring and the third wiring become low.

7. The electronic apparatus according to claim 1, wherein the wiring circuit board further includes:
a first ground pattern that is provided on the second surface or inside the wiring circuit board, and connects the first ball electrode and the first extension pad, and
a second ground pattern that is provided on the second surface or inside the wiring circuit board, and connects the second ball electrode and the second extension pad.

8. The electronic apparatus according to claim 7, wherein
the first ground pattern and the second ground pattern are disposed in the same layer that is inside the wiring circuit board,
the first extension pad is a portion of the first ground pattern exposed on the second surface side, and
the second extension pad is a portion of the second ground pattern exposed on the second surface side.

9. The electronic apparatus according to claim 7, wherein
the first ground pattern is disposed in a first layer that is inside the wiring circuit board and the second ground pattern is disposed in a second layer that is inside the wiring circuit board,
the first extension pad is a portion of the first ground pattern exposed on the second surface side, and
the second extension pad is a portion of the second ground pattern provided in the second layer, the portion extending to the first layer and being exposed on the second surface side.

10. The electronic apparatus according to claim 1, wherein
the plurality of wirings includes a third wiring provided on the wiring circuit board,
the third wiring is a ground wiring that supplies a ground potential to a third circuit block among the plurality of circuit blocks,
the second surface further includes a third extension pad and a fourth extension pad,
the third extension pad is connected to a third ball electrode connected to the third wiring,
the fourth extension pad is connected to the first ball electrode connected to the first wiring,
the first ball electrode is one of the plurality of ball electrodes provided on the second surface, and
the third extension pad and the fourth extension pad are disposed at positions at which the third extension pad and the fourth extension pad are connected to each other on the second surface side through a single ball electrode.

11. The electronic apparatus according to claim 10, wherein
before the third extension pad and the fourth extension pad are connected through the single ball electrode, an individual impedance of the third wiring is high with respect to an individual impedance of the first wiring, and after the third extension pad and the fourth extension pad are connected through the single ball electrode, the individual impedance of the third wiring becomes low.

12. The electronic apparatus according to claim 10, further comprising a third via configured to connect the third wiring and the third extension pad.

13. A circuit board comprising:

a semiconductor chip provided with a plurality of circuit blocks and a plurality of first electrode pads connected to any of the plurality of circuit blocks;

a first surface on which the semiconductor chip is mounted; and a second surface facing a mounting substrate on which a wiring circuit board is mounted, wherein the first surface includes:

a plurality of second electrode pads connected to the plurality of first electrode pads provided on the semiconductor chip, through a wire, and a plurality of wirings connected to the plurality of second electrode pads, the second surface includes a plurality of ball electrodes connected to any of the plurality of wirings and disposed to come into contact with any of a plurality of opposing pads provided on the mounting substrate, a first wiring among the plurality of wirings is a ground wiring for supplying a ground potential to a first circuit block among the plurality of circuit blocks, a second wiring among the plurality of wirings is a ground wiring for supplying a ground potential to a second circuit block among the plurality of circuit blocks, the second surface further includes a first extension pad connected to a first ball electrode connected to the first wiring and a second extension pad connected to a second ball electrode connected to the second wiring, and the first extension pad and the second extension pad are disposed at positions at which the first extension pad and the second extension pad are connected to each other on the second surface side through a single ball electrode.

14. A semiconductor device comprising:

a semiconductor chip provided with a plurality of circuit blocks and a plurality of first electrode pads connected to any of the plurality of circuit blocks;

a wiring circuit board on which the semiconductor chip is mounted; and a sealer that seals the semiconductor chip on the wiring circuit board, wherein the wiring circuit board includes:

a first surface on which the semiconductor chip is mounted, and a second surface that faces a mounting substrate on which the semiconductor device is mounted, the first surface includes:

a plurality of second electrode pads connected to the plurality of first electrode pads provided on the semiconductor chip, using a wire, and a plurality of wirings connected to any of the plurality of second electrode pads, the second surface includes a plurality of ball electrodes connected to any of the plurality of wirings and disposed to come into contact with any of a plurality of opposing pads provided on the mounting substrate, a first wiring among the plurality of wirings is a ground wiring for supplying a ground potential to a first circuit block among the plurality of circuit blocks, a second wiring among the plurality of wirings is a ground wiring for supplying a ground potential to a second circuit block among the plurality of circuit blocks, the second surface further includes a first extension pad connected to a first ball electrode connected to the first wiring and a second extension pad connected to a second ball electrode connected to the second wiring, and the first extension pad and the second extension pad are disposed at positions at which the first extension pad and the second extension pad are connected to each other on the second surface side through a single ball electrode.

* * * * *